US009325062B2

(12) United States Patent
Pajona et al.

(10) Patent No.: US 9,325,062 B2
(45) Date of Patent: Apr. 26, 2016

(54) HIGH SPEED TUNABLE MATCHING NETWORK FOR ANTENNA SYSTEMS

(71) Applicants: Olivier Pajona, San Diego, CA (US); Laurent Desclos, San Diego, CA (US)

(72) Inventors: Olivier Pajona, San Diego, CA (US); Laurent Desclos, San Diego, CA (US)

(73) Assignee: ETHERTRONICS, INC., San Diego, CA (US)

(*) Notice: Subject to any disclaimer, the term of this patent is extended or adjusted under 35 U.S.C. 154(b) by 440 days.

(21) Appl. No.: 13/717,441

(22) Filed: Dec. 17, 2012

(65) Prior Publication Data

US 2013/0187829 A1 Jul. 25, 2013

Related U.S. Application Data

(63) Continuation-in-part of application No. 13/675,981, filed on Nov. 13, 2012.

(60) Provisional application No. 61/590,303, filed on Jan. 24, 2012.

(51) Int. Cl.
*H01Q 1/50* (2006.01)
*H03H 7/40* (2006.01)

(52) U.S. Cl.
CPC .. *H01Q 1/50* (2013.01); *H03H 7/40* (2013.01)

(58) Field of Classification Search
CPC .......................................................... H01Q 1/50
USPC ........................................ 343/861, 850, 860
See application file for complete search history.

(56) References Cited

U.S. PATENT DOCUMENTS

| | | | | |
|---|---|---|---|---|
| 7,848,386 B2 * | 12/2010 | Rofougaran | ................... | 375/135 |
| 8,325,097 B2 * | 12/2012 | McKinzie et al. | ............ | 343/703 |
| 8,447,255 B2 * | 5/2013 | Asokan | .......................... | 455/273 |
| 8,787,845 B2 * | 7/2014 | Manssen et al. | ................. | 455/77 |
| 2008/0122723 A1 * | 5/2008 | Rofougaran | ................... | 343/861 |

* cited by examiner

*Primary Examiner* — Huedung Mancuso
(74) *Attorney, Agent, or Firm* — Coastal Patent Law Group, P.C.

(57) ABSTRACT

A communication system is provided, including an antenna, a matching network coupled to the antenna, a controller configured to host an algorithm for controlling the matching network, and a look-up table coupled to the controller. The look-up table includes characterization data according to frequency bands and conditions. The controller is configured to refer to the look-up table to determine optimum impedance for a frequency band selected under a condition detected during a time interval, and adjust the matching network to provide the optimum impedance. Part or all of the sections related to the tunable matching scheme can be integrated on a chip.

7 Claims, 9 Drawing Sheets

| Condition | Band | C1 (pF) | C2 (pF) | L1 (nH) | L2 (nH) | ... |
|---|---|---|---|---|---|---|
| 1 | 1 | 0.1 | 0.5 | 0.5 | 1 | |
| 1 | 2 | 1 | 3 | 2 | 6 | |
| 1 | 3 | 2 | 5 | 10 | 15 | |
| 1 | 4 | 10 | 30 | 5 | 3 | |
| 2 | 1 | 3 | 0.1 | 3 | 7 | |
| 2 | 2 | 5 | 2 | 10 | 4 | |
| 2 | 3 | 15 | 20 | 20 | 9 | |
| 2 | 4 | 1 | 3 | 5 | 20 | |
| 3 | 1 | 6 | 5 | 0 | 30 | |
| 3 | 2 | 0 | 8 | 0 | 8 | |
| 3 | 3 | 8 | 0.5 | 15 | 0 | |
| 3 | 4 | 12 | 0 | 3 | 2 | |
| ... | | | | | | |

FIG. 3

HIGH SPEED TUNABLE MATCHING NETWORK FOR ANTENNA SYSTEMS

CROSS REFERENCE

This application is a Continuation in Part (CIP) of U.S. patent application Ser. No. 13/675,981, filed Nov. 13, 2012, and titled "TUNABLE MATCHING NETWORK FOR ANTENNA SYSTEMS"; which claims benefit of priority to Provisional Ser. No. 61/590,303, filed Jan. 24, 2012, having the same title; the content of each of which are hereby incorporated by reference.

BACKGROUND

Frequency bands associated with various protocols are specified per industry standards for cell phone and mobile device applications, WiFi applications, WiMax applications and other wireless communication applications. As new generations of wireless communication devices become smaller and packed with more multiband functions, designing new types of antennas and associated air interface circuits is becoming increasingly important. In particular, a communication device with an air interface tends to be affected by use conditions such as the presence of a human hand, a head, a metal object or other interference-causing objects placed in the vicinity of an antenna, resulting in impedance mismatch and frequency shift at the antenna terminal. Accordingly, an impedance matching solution is required in the device to optimize the performance by adjusting impedances over multiple bands as well as according to use conditions and environment while using as little real estate as possible.

BRIEF DESCRIPTION OF THE DRAWINGS

FIG. 3 illustrates an example of the look-up table (LUT).

DETAILED DESCRIPTION

A conventional communication system with a passive antenna generally is not capable of readjusting its functionality to recover optimum performances when a change in impedance detunes the antenna, causing a change in system load and a shift in frequency. A tunable antenna can be used to alleviate the perturbed properties by controlling the beam, frequency response, impedance and other antenna characteristics so as to recover the optimum performances. See, for example, U.S. Pat. No. 6,900,773, No. 7,830,320 and No. 7,911,402, which describe examples of active tunable antennas.

Additionally or alternatively, a tunable matching network can be used to provide proper impedance for the use condition or environment during a time interval based on information on the mismatch. The U.S. patent application Ser. No. 13/675,981, entitled "TUNABLE MATCHING NETWORK FOR ANTENNA SYSTEMS," filed on Nov. 13, 2012, describes a flexible and tailored matching scheme capable of maintaining the optimum system performances for various frequency bands, conditions, environments and surroundings. In particular, the present matching scheme provides matching network configurations having impedance values tailored for individual scenarios. This scheme is fundamentally different from a conventional scheme of providing beforehand impedance values corresponding to discrete points in the Smith chart based on combinations of fixed capacitance values, which may be unnecessarily excessive, wasting real estate, and/or missing optimum impedance values. Specifically, in the conventional fixed-capacitance scheme, termed a binary scheme herein, the capacitors and switches are binary-weighted from a least significant bit (LSB) to a most significant bit (MSB). On the other hand, in the present tailored scheme, impedance values are optimized in advance according to frequency bands and detectable conditions including use conditions and environments. The entire content of the above U.S. Patent Application is incorporated herein by reference and summarized below.

Figure 1:
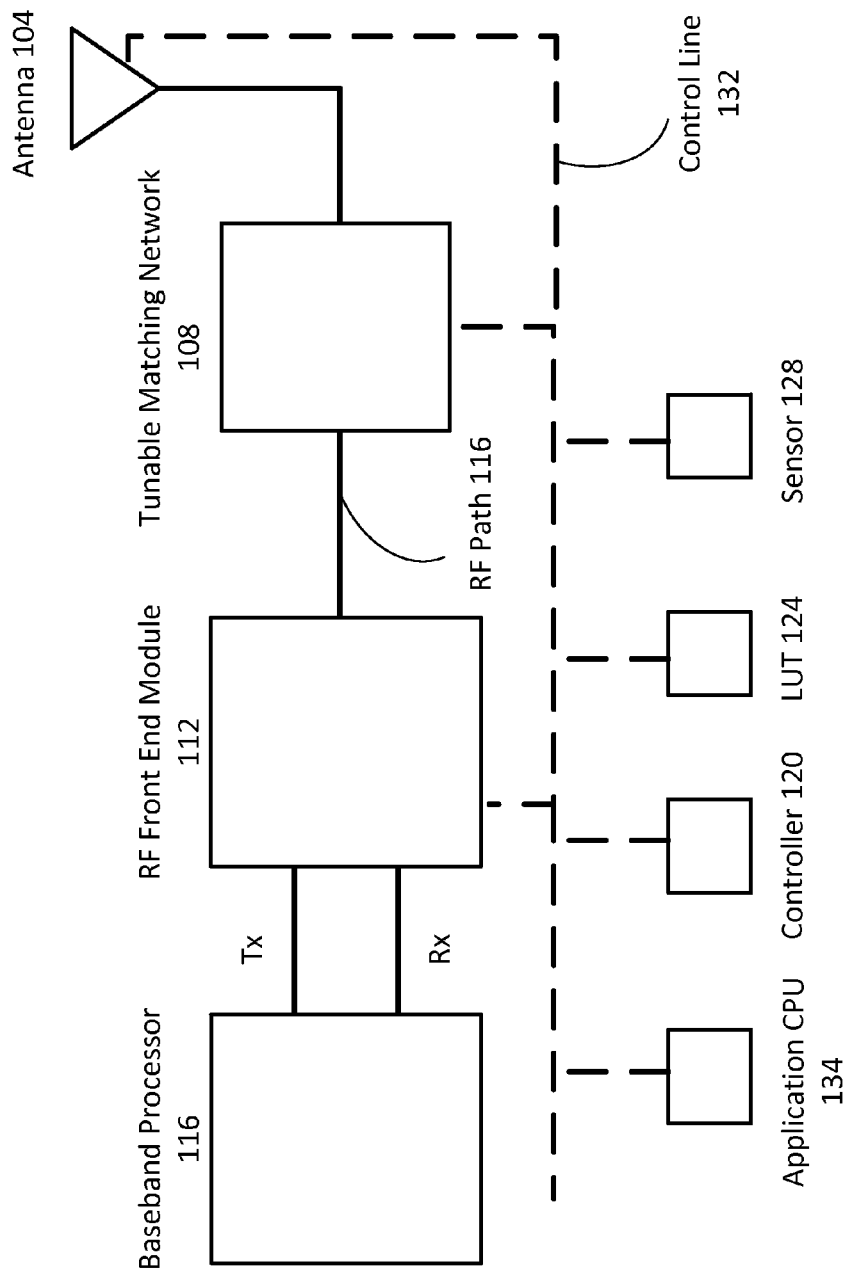
FIG. 1 illustrates an example of a communication system using the tailored scheme.

FIG. 1 illustrates an example of a communication system using the tailored scheme. This system includes an antenna 104, which is a single antenna for transmit (Tx) and receive (Rx) in this example. The antenna 104 is coupled to a tunable matching network 108, which is coupled to an RF front end module 112. This example explicitly shows a baseband processor 116 for managing radio functions. The baseband processor 116 may also be referred to as a baseband CPU or a modem in this case. These RF components and modules are coupled to each other through an RF path 116 (solid line). The RF front end module 112 may include a duplexer to split the RF path 116 into a Tx path and an Rx path, a power amplifier coupled to the Tx path, a low noise filter coupled to the Rx path, and various other components and modules to process the RF signals. Instead of using a single antenna for Tx and Rx as in FIG. 1, the antenna 104 may be configured to be multiple antennas handling multi-mode multi-band communication. Tx and Rx functions may be carried out by one antenna, or be separated by different antennas.

In the example of FIG. 1, a controller 120, a look-up table (LUT) 124 and a sensor 128 are coupled to each other through a control line 132 (dashed line), enabling the controller 120 to adjust the tunable matching network 108 based on input information. This example explicitly shows an application CPU 134 coupled to the control line 132. The application CPU 134 generally runs the operation system (OS) for high level functions and manages various peripherals, and may be separated from the controller 120 that is left to predominantly perform the control of the tunable matching network 108. The application CPU 134 may be designed to be part of the controller 120, or the controller 120 may be integrated with the application CPU 134, so that the control section can perform all the control at high levels as well as specific to the tunable matching scheme. The sensor 128 may include one or more sensors such as a proximity sensor, a motion sensor, a light sensor, a pressure sensor or other types of sensors, to detect the use condition and/or the environment and send the detected information to the controller 120. Some information, for example, the frequency band being selected, may be sent from the application CPU 143 to the controller 120. The controller 120 is configured to include an algorithm to drive the components in the tunable matching network 108 to adjust the impedance with reference to the entries in the LUT 124 according to the input information, such as those provided by the sensor 128, the application CPU 134, and/or other sources. Additionally, the components and modules in the RF front end module 112 may be controlled by the controller 120 for optimal signal processing. Furthermore, the controller 120 may be configured to control, in addition to the modules and components in the RF front end module 112 and in the tunable matching network 108, the antenna 104 if the aforementioned active tunable antenna is used, for example. The LUT 124 tabulates measured and/or predetermined data associated with antenna characteristics, and the algorithm is configured to optimize the system performance by using the entries in the LUT 124 according to time-varying conditions, such as perturbations due to the placement of a head, a hand, or other interference-causing objects nearby. The entries in the LUT 124 can be updated as needed by using the application CPU 134, for example.

Bidirectional control can be realized, for example, by using an interface specified by the Mobile Industry Processor Interface (MIPI) Alliance, General Purpose Input/Output (GPIO), Serial Parallel Interface (SPI), or Inter-Integrated Circuit ($I^2C$). See, for example, a white paper entitled "Tuning Technology: Key Element to Lower Operating Costs While Improving Wireless Network Performance," released on Feb. 8, 2011, by IWPC (International Wireless Industry Consortium). The control lines 132 may be designed to incorporate such bidirectional control using a conventional bus, wires, or other suitable forms.

Figure 2:
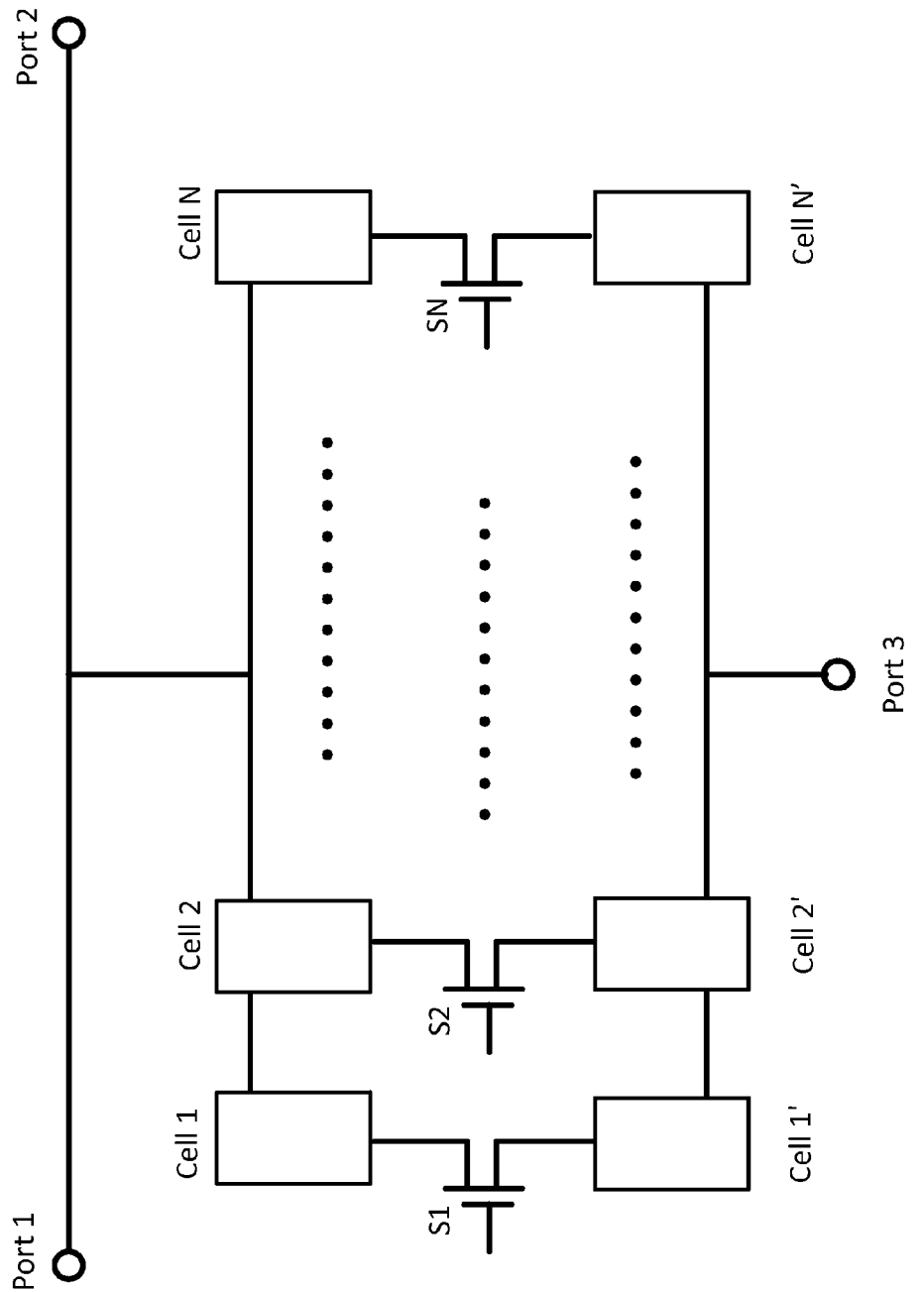
FIG. 2 illustrates an example of a configuration of the tunable matching network according to the tailored matching scheme.

FIG. 2 illustrates an example of a configuration of the tunable matching network (TMN) according to the tailored matching scheme. See the U.S. patent application Ser. No. 13/675,981, entitled "TUNABLE MATCHING NETWORK FOR ANTENNA SYSTEMS," filed on Nov. 13, 2012, for more configuration examples of the tunable matching network. The configuration of FIG. 2 includes multiple switches S1, S2 . . . and SN; and component blocks cell 1, cell 2 . . . and cell N, and cell 1', cell 2' . . . and cell N'. Each switch is coupled to a first cell on one side and a second cell on the other side in series. The branches, each branch having a switch, a first cell on one side of the switch and the second cell on the other side of the switch, are coupled together in parallel. One end of the paralleled branches is coupled to the path coupled to port 1 and port 2; and the other end of the paralleled branches is coupled to port 3. This configuration may provide convenience and ease in designing a shunt circuit by coupling ports 1 and 2 to the RF path, with an option of coupling port 3 to another circuit, module or component in the system, shorting it to ground or keeping it open. This configuration can also be used as a series circuit by coupling port 1 (or 2) and port 3 to the RF path, with an option of coupling port 2 (or 1) to another circuit, module or component in the system, shorting it to ground or keeping it open. Each cell may include one or more components such as capacitors and/or inductors. The gate (or base) terminals of the switches S1, S2 . . . and SN are controlled by the controller 120. By turning on one of the switches, this tunable matching network can provide N possible impedance states, which are determined by the combinations of cell 1+cell 1', cell 2+cell 2' . . . and cell N+cell N'. Furthermore, additional impedance states can be provided by turning on two or more switches. Thus, the tuning matching network is capable of providing customized impedance states that are predetermined based on frequency bands and expected conditions, environments and others.

FIG. 3 illustrates an example of the LUT 124. Measured and/or predetermined parameters under various conditions and/or specifications may be stored in the LUT 124 to adjust impedances and other properties. For example, the LUT 124 may include characterization data of the antenna 104, such as total radiated power (TRP), total isotropic sensitivity (TIS), specific absorption rate (SAR), radiation patterns and so on, which can be measured in advance for various conditions, e.g., in free space, in the presence of a head, a hand, laps, wood, metal, etc. with different positions and angles. Measured S parameters such as S12 and S11 may also be included. These LUT entries may be updated as needed so that the algorithm can converge faster to an optimum operation. The example in FIG. 3 shows a portion of the LUT 124, where the capacitance and inductance values in a cell are listed according to conditions and bands. For example, condition 1 may refer to the presence of a head with an ear in parallel with the handset; condition 2 may refer to the presence of a metal touching the handset, etc. The device is assumed to operate over four bands 1, 2, 3, and 4 in this table; for example, the frequencies for the Tx of band 1 are 1920-1980 MHz, and the frequencies for the Rx of band 1 are 2110-2170 MHz, the frequencies for the Tx of band 2 are 1850-1910 MHz, and the frequencies for the Rx of band 2 are 1930-1950 MHz, the frequencies for the Tx of band 3 are 1710-1755 MHz, and the frequencies for the Rx of band 3 are 1805-1880 MHz, etc. The capacitance and inductance values may be obtained through measurements of the S parameters, for example, for each band under each condition. The condition during a time interval can be detected by the sensor 128, and the information can be sent to the controller 120, which then refers to the LUT 124 to determine the values of C1, C2, L1 and L2 that can provide the optimum impedance state to recover optimum performances under the condition and for the selected band during the time interval. The predetermined impedance states, as tabulated in the LUT 124, are implemented by the cells. Accordingly, the controller 120 turns on one or more switches coupled to the cells that provide the optimum impedance for the band and the condition during the time interval. The present scheme, therefore, eliminates unnecessary impedance states to be prepared, such as those in the excessive capacitance states (e.g. $2^6$) prepared in a binary-weighing scheme. Specifically, the number of possible impedance states afforded by the present tunable matching network 108 is determined to correspond to the number of possible scenarios that the system may encounter, thereby eliminating circuit configurations providing potentially unused impedance states. Furthermore, each impedance state is customized, based on the measured and/or calculated data, for a particular band and a condition, thereby providing tailored impedance matching that conventional binary-weighing schemes do not provide.

Turning back to FIG. 1, it can be seen that a communication system such as this example involves digital computing capability (logic and memory) along with analog and RF circuitry. Current wireless products generally divide digital, analog and RF functions among several chips combined with several external components. Combining these functions on a single chip would enhance product performance and reliability while decreasing size, power consumption and manufacturing costs. However, since different functions are normally manufactured in different technologies, attempts to achieve high levels of integration have proven difficult and unsatisfactory. An intelligent communication system such as the example of FIG. 1 includes more complexities and functionalities than a generic system, as represented by those associated with the tailored matching scheme. Therefore, the level of integration in the present case may be considered with respect to part or all of the modules and sections associated with the tailored matching scheme, such as the tunable matching network 108, the controller 120 and the LUT 124.

Figure 4:
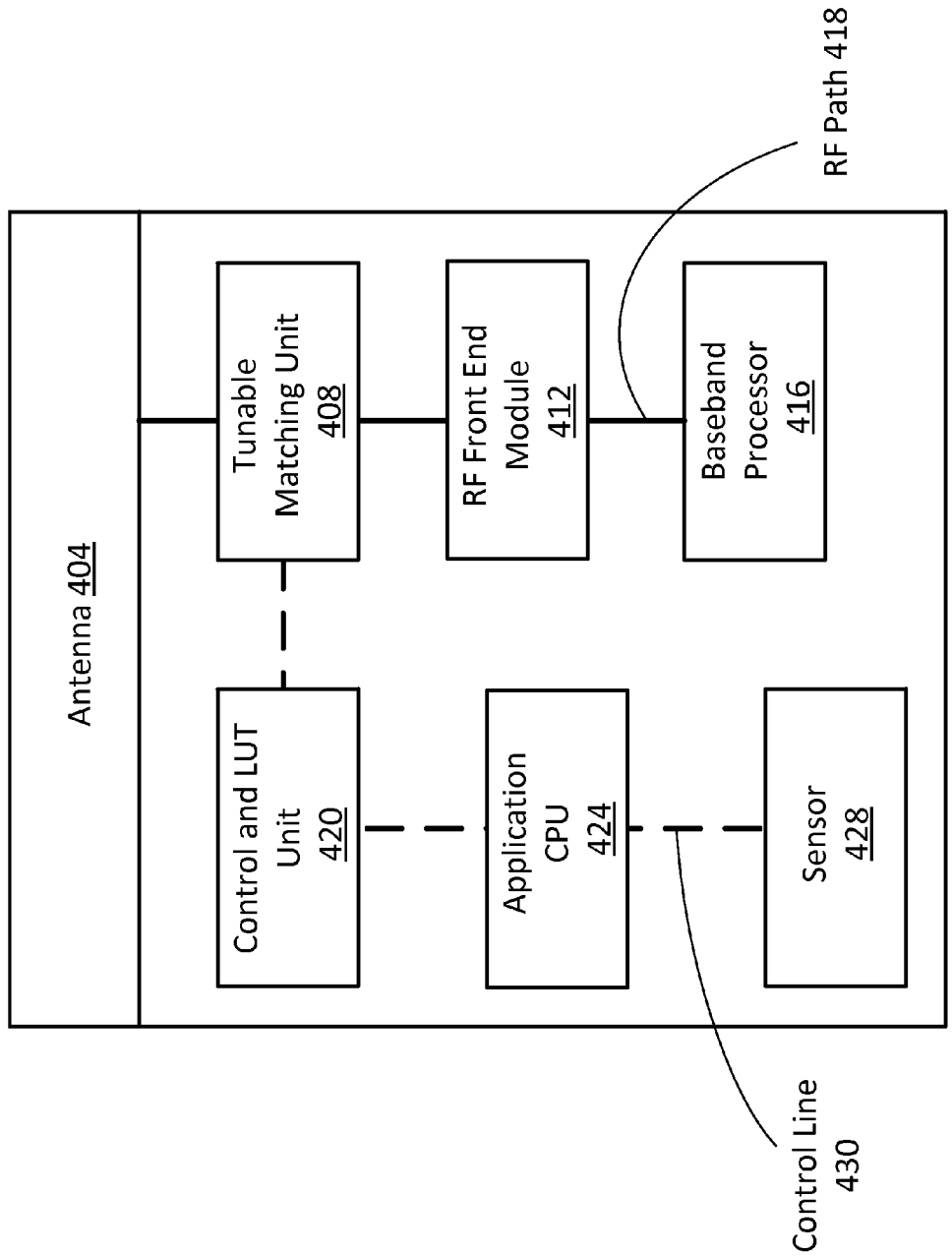
FIG. 4 is a block diagram illustrating an example of a communication system implemented on a PCB.

FIG. 4 is a block diagram illustrating an example of a communication system implemented on a PCB. An antenna 404 is placed at the edge of the PCB based on considerations on air interface and radiation efficiency. The antenna 404 is coupled to a tunable matching unit 408. As in the example of FIG. 1, the tunable matching unit 408 is coupled to an RF front module 412, which is coupled to a baseband processor 416. The antenna 404, the tunable matching unit 408, the RF front end module 412 and the baseband processor 416 are coupled to each other through an RF path 418 (solid line). A control and LUT unit 420 is coupled the tunable matching unit 408, an application CPU 424 and a sensor 428 through a control line 430 (dashed line). The control and LUT unit 420 accommodates functions corresponds to those of the controller 120 and the LUT 124 in the example of FIG. 1, and may be integrated using a logic chip, such as a field-programmable gate array (FPGA). An FPGA generally supports thousands of gates, providing vast design flexibility, and can be programmed after manufacturing. That is, an FPGA allows a designer to program product features and functions, adapt them to new standards, and reconfigure hardware for specific applications even after the product has been installed in the field. An FPGA can be used to implement logical functions that an application specific integrated circuit (ASIC) could perform, but the ability to update the functionality after shipping offers flexibility for many applications. Therefore, the FPGA technology can provide a suitable platform to integrate the controller 120 and the LUT 124, wherein updates and adaptation to new standards may often be required for the entries of the LUT 124. The control and LUT unit 420 is coupled to the application CPU 424, which runs the operation system (OS) for high level functions and manages various peripherals. Thus, the control functions for the tunable matching scheme are implemented in the control and LUT unit 420, relieving the application CPU 424 from the specific tasks related to the tunable matching scheme in this example.

Figure 5:
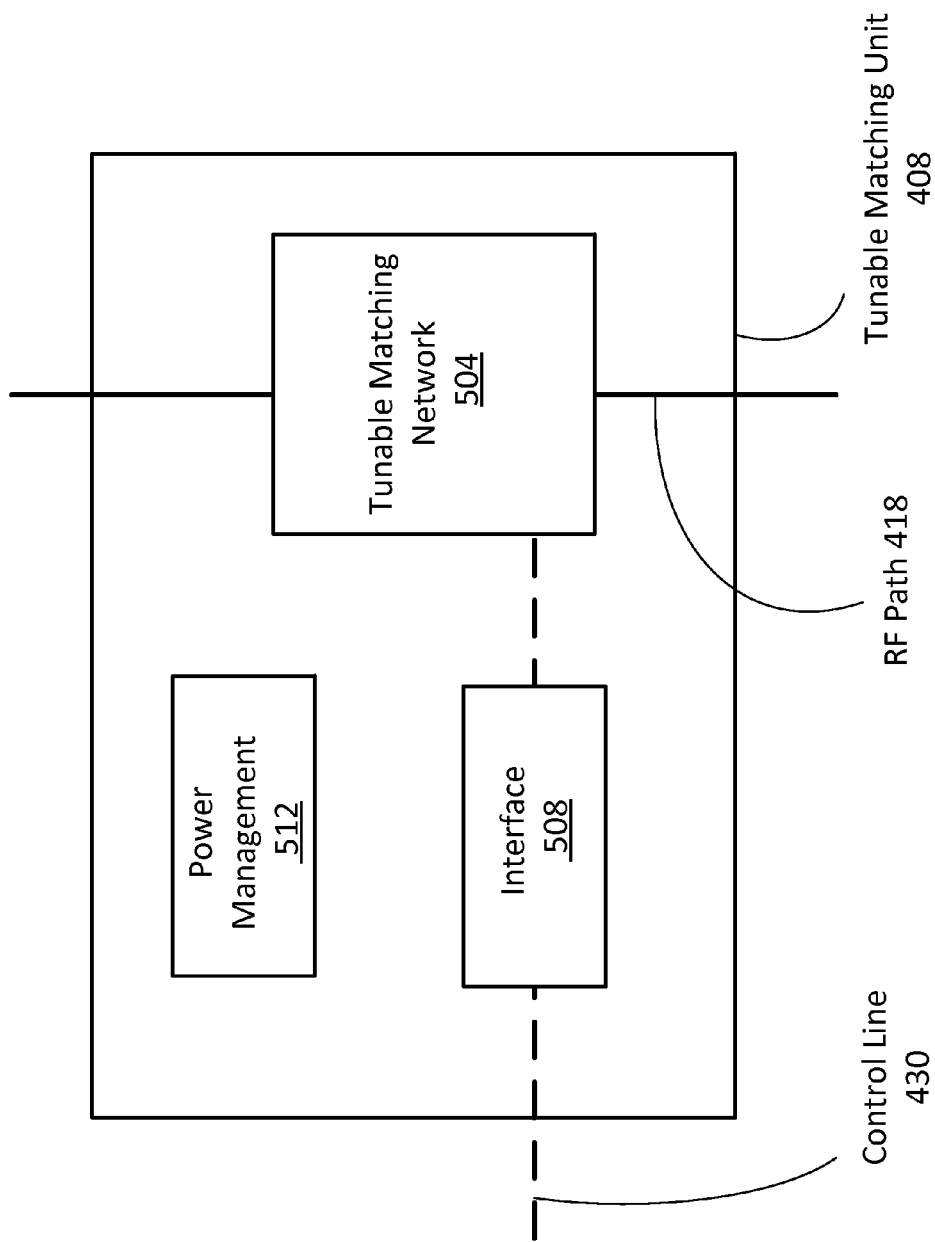
FIG. 5 is a block diagram illustrating the tunable matching unit 408 of FIG. 4.

FIG. 5 is a block diagram illustrating the tunable matching unit 408 of FIG. 4. The tunable matching unit 408 represents an integrated circuit on a chip carrying the functions of a tunable matching network 504 that has a configuration such as the example shown in FIG. 2, wherein each cell includes one or more capacitors and/or one or more inductors, and each impedance state is selected by controlling the switches therein. The tunable matching network 504 represents an integrated version of the tunable matching network 108 of FIG. 1, and is coupled to the antenna 404 on one side and the RF front end module 412 on the other side through the RF path 418. The integration of the chip may be performed based on a conventional CMOS, silicon-on-insulator (SOI) CMOS, bipolar, GaAs- or InP-based fabrication technology, or any other suitable fabrication technology. The tunable matching unit 408 further includes an interface 508 and a power management section 512. Examples of the interface 508 include a bidirectional SPI as mentioned earlier, interfacing with the control and LUT unit 420 through the control line 430 and enabling the control and LUT unit 420 to adjust the tunable matching network 508 based on input information including the frequency band selected and conditions, such as the environment and surroundings, detected by the sensor 428. The power management section 512 performs general power management to save power of the chip according to use parameters such as voltages, temperatures, current handling of components, and various others.

Figure 6:
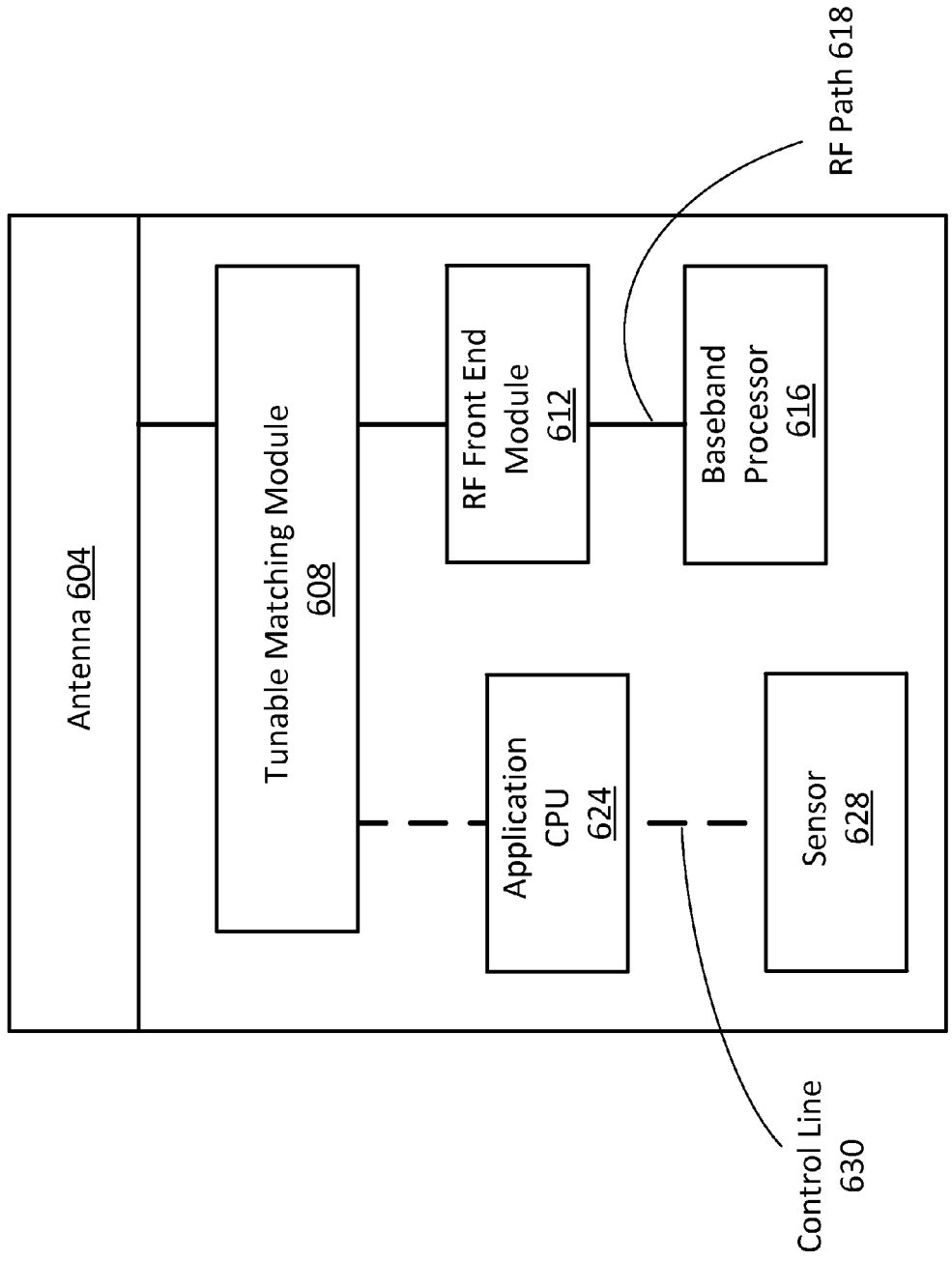
FIG. 6 is a block diagram illustrating another example of a communication system implemented on a PCB.

FIG. 6 is a block diagram illustrating another example of a communication system implemented on a PCB. An antenna 604 is placed at the edge of the PCB based on considerations on air interface and radiation efficiency. The antenna 604 is coupled to a tunable matching module 608. The tunable matching module 608 is coupled to an RF front module 612, which is coupled to a baseband processor 616. The antenna 604, the tunable matching module 608, the RF front end module 612 and the baseband processor 616 are coupled to each other through an RF path 618 (solid line). The tunable matching module 608 is also coupled to an application CPU 624 and a sensor 628 through a control line 630 (dashed line). Referring back to FIG. 4, the control and LUT unit 420 is configured to accommodate functions corresponding to those of the controller 120 and the LUT 124 of the example of FIG. 1, which are integrated on a chip by using an FPGA in the example of FIG. 4. In contrast, in the example of FIG. 6, the tunable matching module 608 is configured to accommodate functions corresponding to those of the tunable matching network 108, the controller 120 and the LUT 124 in the example of FIG. 1, which are integrated on a chip. The tunable matching module 608 is coupled to the application CPU 624, which runs the operation system (OS) for high level functions and manages various peripherals. Thus, the control functions for the tunable matching scheme are implemented in the tunable matching module 608, relieving the application CPU 624 from the specific tasks related to the tunable matching scheme in this example.

Figure 7:
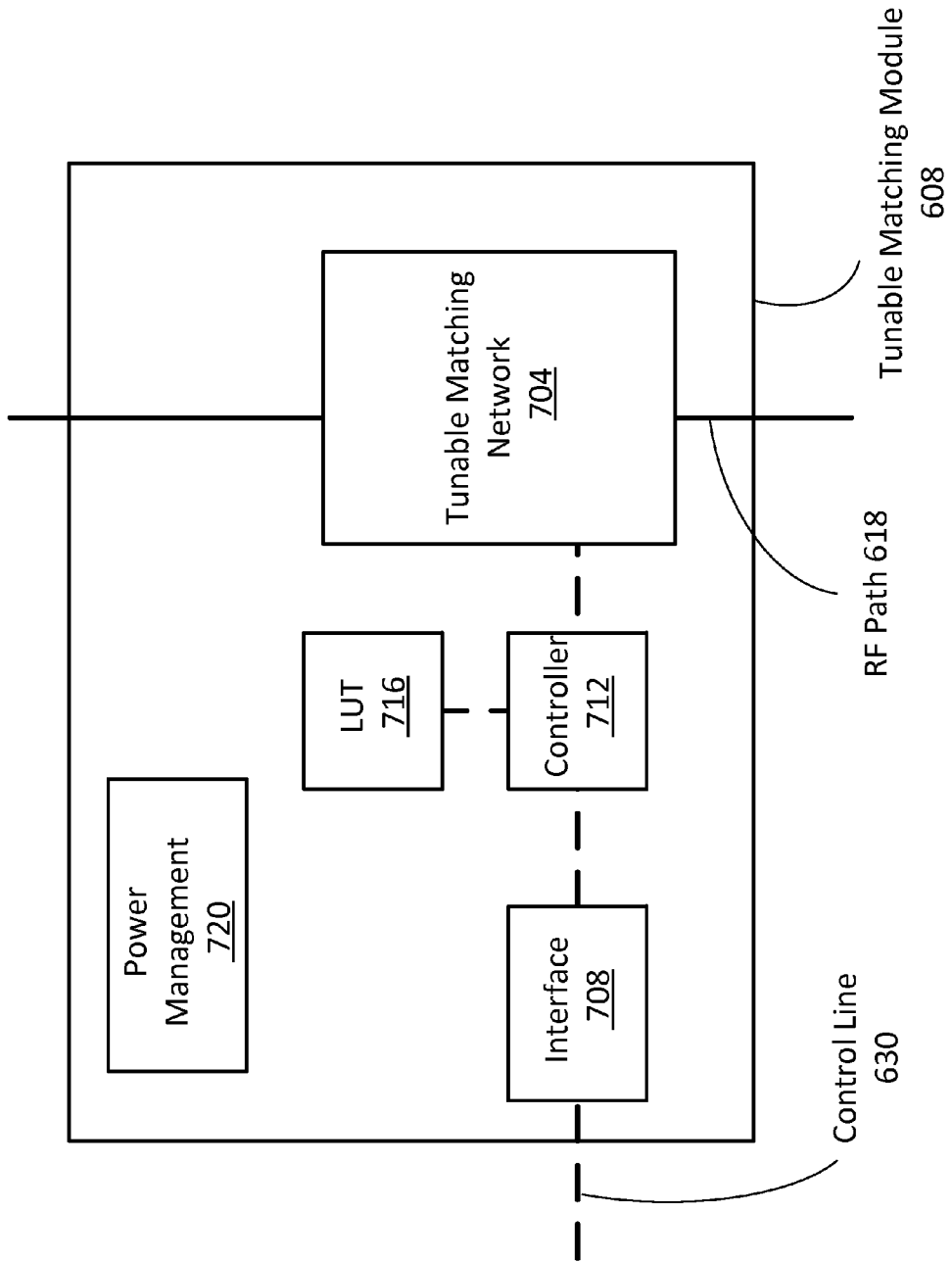
FIG. 7 is a block diagram illustrating the tunable matching module 608 of FIG. 6.

FIG. 7 is a block diagram illustrating the tunable matching module 608 of FIG. 6.

The tunable matching module 608 represents an integrated circuit on a chip carrying various functions, including the functions of a tunable matching network 704 that has a configuration such as the example shown in FIG. 2, wherein each cell includes one or more capacitors and/or one or more inductors, and each impedance state is selected by controlling the switches therein. The tunable matching network 704 represents an integrated version of the tunable matching network 108 of FIG. 1, and is coupled to the antenna 604 on one side and to the RF front end module 612 on the other side through the RF path 618. The integration of the chip may be performed based on a conventional CMOS, silicon-on-insulator (SOI) CMOS, bipolar, GaAs- or InP-based fabrication technology, or any other suitable fabrication technology. The tunable matching module 608 further includes an interface 708, a controller 712, an LUT 716 and a power management section 720. Examples of the interface 708 include a bidirectional SPI as mentioned earlier, interfacing with the application CPU 624 and the sensor 628. The controller 712 and the LUT 716 are integrated on the chip, forming the part of the tunable matching module 608 in this example. The entries of the LUT 716, such as the example of FIG. 3, may be stored in a random access memory (RAM), a read only memory (ROM) or by using any other suitable memory technology. Through the control line 630, the controller 712 is configured to adjust the tunable matching network 704 with reference to the LUT 716 based on input information including the frequency band selected and conditions, such as the environment and surroundings, detected by the sensor 628. The control functions of the controller 712 are separated from those of the application CPU 624, and can be configured to be specific to controlling the tunable matching network 704. Thus, the controller 712 can be made simple and small with relatively low fabrication costs owing to the use of the integrated solution. The controller 712 is configured to include an algorithm to adjust the tunable matching network 704 with reference to the entries in the LUT 716 according to the input information sent from the sensor 628, the application CPU 624 and/or other sources. Additionally, fast switching speed can be achieved in the integrated solution compared to the discrete solution. The power management section 720 performs general power management to save power of the chip according to use parameters such as voltages, temperatures, current handling of components, and various others.

The switching speed of the integrated solution can generally be 10 times or more faster than the discrete solution. Accordingly, device performance can be enhanced by including algorithms to take advantage of the fast speed for various applications. For example, problems associated with path discontinuity, as explained below with reference to FIG. 8, may be alleviated based on considerations including the switching characteristics associated with the integrated circuit on a chip.

Figure 8:
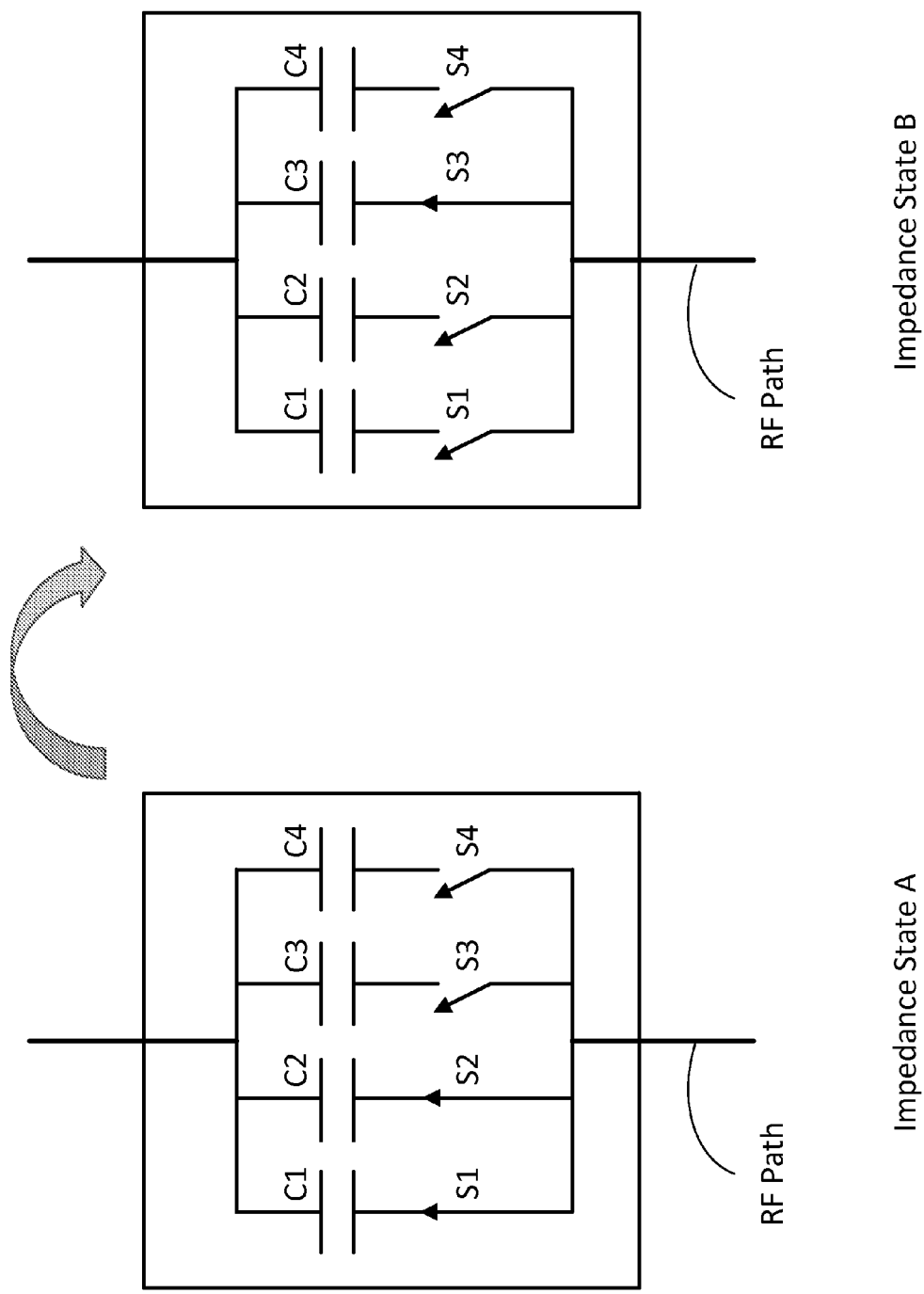
FIG. 8 illustrates an example of a transition from one impedance state to another of the tunable matching network.

FIG. 8 illustrates an example of a transition from one impedance state to another of the tunable matching network. Based on the configuration of the tunable matching network illustrated in FIG. 2, the specific design in FIG. 8 includes four branches in parallel, each branch having one capacitor Ci (i=1, 2, 3 or 4) and one switch Si (i=1, 2, 3 or 4) in series, wherein one end of the paralleled branches is coupled to port 1 or port 2 (with the other unused port being open); and the other end of the paralleled branches is coupled to port 3. Here, the ports 1, 2 and 3 are referred to with respect to the configuration of the tunable matching network illustrated in FIG. 2. The RF path can be coupled to the antenna on one end and the RF front end module on the other end. The present tunable matching network in FIG. 8 is shown to be coupled in series with the RF path; however, the shunt configuration is also possible as explained earlier with reference to FIG. 2. This configuration represents a simple example that can be used for the tunable matching network 104 of FIG. 1, 504 of FIG. 5 or 704 of FIG. 7 according to the present tunable matching scheme. In the example of FIG. 8, the impedance sate A provides the impedance of C1+C2, while the impedance state B provides the impedance of C3. During the transition, the initially-on switches, S1 and S2, first need to be turned off, and then the switch S3 needs to be turned on. Therefore, the RF path is briefly disconnected, however short the time duration is, during the transition from A to B. This path discontinuity can give rise to problems in the whole RF chain, such as phase shift distortion, phase lock loop (PLL) unlocking, power reflection burst, etc. leading to a call drop in a cellular phone, for example.

Figure 9:
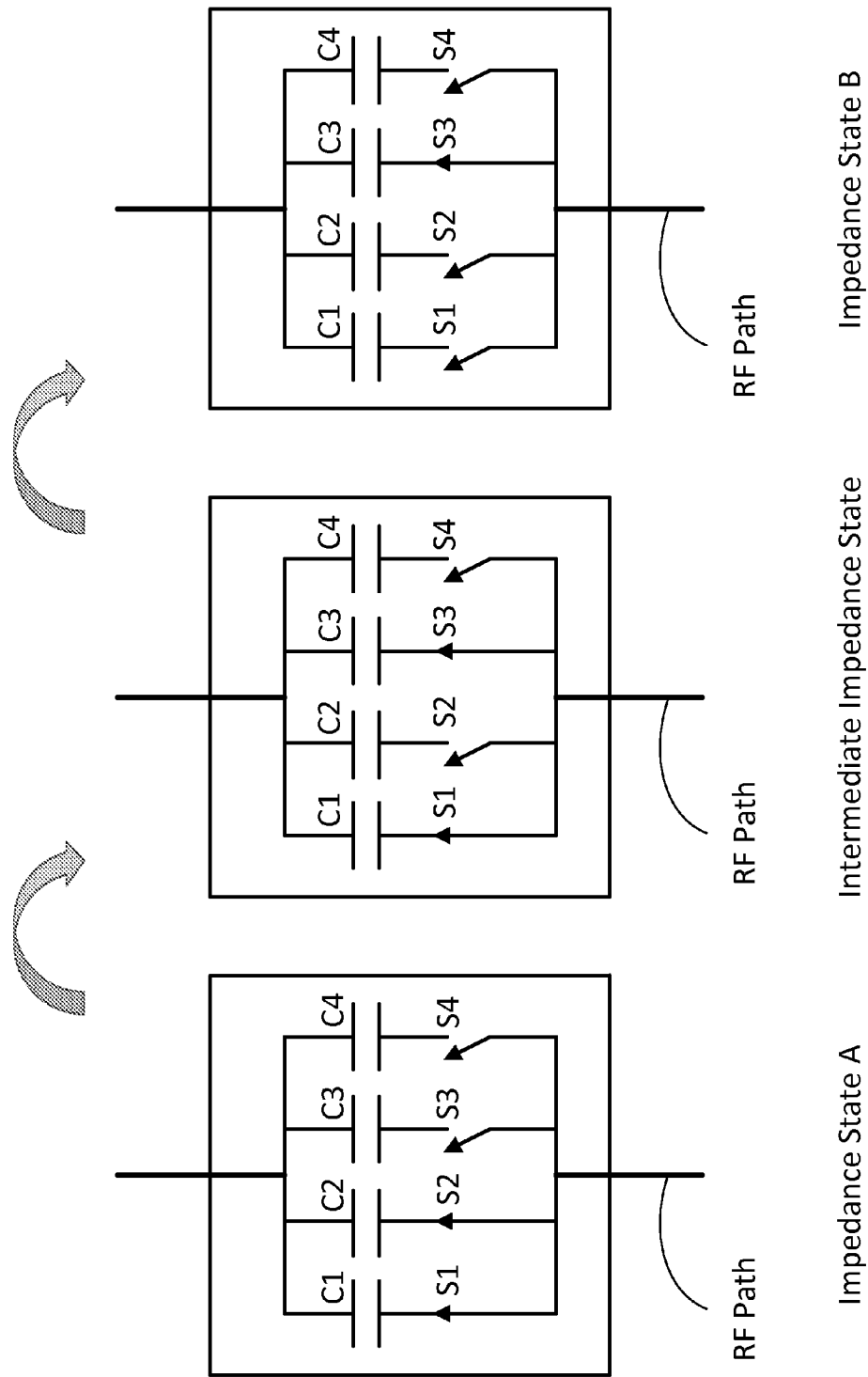
FIG. 9 illustrates an example of a transition from one impedance state to another of the tunable matching network without introducing the path discontinuity.

One way to avoid the path discontinuity is to introduce an intermediate state to achieve a smooth impedance variation and hence a smooth phase change. FIG. 9 illustrates an example of a transition from one impedance state to another of the tunable matching network without introducing the path discontinuity. In this example, an intermediate impedance state is provided between the impedance states A and B. Initially the impedance state A provides the impedance of C1+C2 by turning on the switches S1 and S2. Instead of directly transitioning to the impedance state B that provides the impedance of C3, the intermediate state is introduced to provide the impedance of C1+C3. In this way, during the transition from the impedance A to the intermediate impedance state, S1 is kept on while S2 is turned off and S3 is turned on. Thereafter, the transition from the intermediate impedance state to the impedance state B is carried out by keeping S3 on while turning off S1. As a result of creating the sequence of configurations corresponding to the impedances, C1+C2→C1+C3→C3, the originally intended transition from the impedance state A to B, i.e., C1+C2→C3, is carried out without disconnecting the path owing to the provision of the intermediate impedance state.

As mentioned earlier regarding the present tunable matching scheme, the controller such as 712 in FIG. 7 is configured to include an algorithm to control the components in the tunable matching network, such as 704 in FIG. 7, to adjust the impedance. The LUT such as 716 in FIG. 7 tabulates measured and/or predetermined data associated with antenna characteristics including component values for each impedance state, and the algorithm is configured to optimize the system performance based on the entries in the LUT according to frequency bands and time-varying conditions, such as perturbations due to the placement of a head, a hand, or other interference-causing objects in the proximity of the antenna. The input information such as the frequency band selected and the condition detected may be provided by the application CPU 624 and the sensor 628, respectively, for example. Other sourcing components or modules may also be utilized. The algorithm to control the components in the tunable matching network to adjust the impedance can be modified to include various intermediate states respectively designed for a wide variety of transitions between different impedance states. As explained with the above example of FIG. 9, each intermediate state is configured to keep on at least one of the switches of the tunable matching network during the transition from the initial to the intermediate state and from the intermediate to the final state. The configuration corresponding to an intermediate state for each transition may be predetermined and stored in the LUT. Alternatively, the algorithm may be configured to include a judgment as to controlling the on/off of the switches for each transition. It is possible for those skilled in the art to devise a wide variety of algorithms, as long as the intended transition avoids the path discontinuity. The algorithm can be included in a controller integrated with the tunable matching network, such as the controller 712 in the tunable matching module 608 in FIG. 7. Alternatively, the algorithm can be included in a controller external to such a section having the tunable matching network; for example, the controller may be part of the control and LUT unit 420 that is separated from the tunable matching unit 408 in FIG. 4. However, the switching time may become longer in this case due to the external interface. Note that the sequence illustrated in FIG. 9 represents a simple example; a wide variety of configuration sequences of the tunable matching network can be devised for the purpose of avoiding the path discontinuity during transitions.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed is:

1. A communication system comprising:
   an antenna;
   a matching network coupled to the antenna;
   a controller configured to control the matching network; and
   a look-up table coupled to the controller, the look-up table including characterization data according to frequency bands and conditions,
   wherein
   the controller is configured to refer to the look-up table to determine optimum impedance for a frequency band selected and under a condition detected during a time interval, and adjust the matching network to provide the optimum impedance,
   and wherein
   the controller and the look-up table are integrated on a chip;
   further characterized in that:
   the matching network comprises a plurality of switches, each switch coupled to one or more cells,
   wherein
   each cell comprises one or more capacitors, one or more inductors, or a combination of one or more capacitors and one or more inductors,
   and wherein
   the controller is configured to adjust the matching network by turning on one or more of the plurality of switches to provide the optimum impedance for the frequency band and the condition, based on a configuration of the cells coupled to the one or more of the plurality of switches that are turned on.

2. The communication system of claim 1, wherein the controller and the look-up table are integrated on a field-programmable gate array (FPGA).

3. The communication system of claim 1, wherein the matching network is integrated with the controller and the look-up table on the chip.

4. The communication system of claim 3, wherein the look-up table is implemented on a memory.

5. The communication system of claim 4, wherein the memory is a read only memory (ROM) or a random access memory (RAM).

6. A method for impedance matching of a communication system that includes an antenna, a matching network coupled to the antenna, a controller configured to control the matching network, and a look-up table coupled to the controller, the look-up table including characterization data according to frequency bands and conditions, wherein the controller is configured to refer to the look-up table to determine optimum impedance for a frequency band selected and under a condition detected during a time interval, and adjust the matching network to provide the optimum impedance, the method comprising:
   first adjusting the matching network to provide a first impedance that is optimum for a first frequency band and a first condition;
   second adjusting the matching network to provide a second impedance that is optimum for a second frequency band and a second condition, wherein a transition from the first impedance to the second impedance is configured to avoid path discontinuity; and
   third adjusting the matching network, between the first and second adjusting, to provide a third impedance based on a configuration sequence to avoid the path discontinuity during the transition from the first to the third impedance and from the third to the second impedance;
   further characterized in that:
   the matching network includes a plurality of switches, each switch coupled to one or more cells, wherein
   the first adjusting comprises turning on first one or more of the plurality of switches to provide the first impedance determined b the cells coupled led to the first one or more of the plurality of switches,
   the third adjusting comprises keeping on at least one switch of the first one or more of the plurality of switches while turning off the other switches and turning on second one or more switches coupled to the cells corresponding to the second impedance; and
   the second adjusting comprises turning off the at least one switch of the first one or more of the plurality of switches while keeping on the second one or more switches to provide the second impedance.

7. The method of claim 6, wherein
   a fast switching speed is provided by integrating the controller, the look-up table and the matching network on a chip.

* * * * *